(12) United States Patent
Ju et al.

(10) Patent No.: US 7,201,584 B1
(45) Date of Patent: Apr. 10, 2007

(54) ELECTRICAL CONNECTOR FOR A CHIP MODULE

(75) Inventors: Ted Ju, Keelung (TW); Wen-Chung Chang, Keelung (TW)

(73) Assignee: Lotes Co., Ltd., Keelung (TW)

( * ) Notice: Subject to any disclaimer, the term of this patent is extended or adjusted under 35 U.S.C. 154(b) by 0 days.

(21) Appl. No.: 11/333,445

(22) Filed: Jan. 18, 2006

(30) Foreign Application Priority Data

Sep. 30, 2005 (CN) .................. 2005 2 0065289

(51) Int. Cl.
*H01R 12/00* (2006.01)
(52) U.S. Cl. ..................... 439/71; 439/66; 439/824
(58) Field of Classification Search ........ 439/404–405, 439/331, 66, 71, 700, 824
See application file for complete search history.

(56) References Cited

U.S. PATENT DOCUMENTS 4,636,026 A * 1/1987 Cooney et al. ............. 439/482
5,290,193 A * 3/1994 Goff et al. .................. 439/331
5,362,241 A * 11/1994 Matsuoka et al. ............ 439/66
5,702,255 A * 12/1997 Murphy et al. ............... 439/71
6,241,560 B1 * 6/2001 Furusawa et al. ........... 439/700

* cited by examiner

*Primary Examiner*—Michael C. Zarroli
(74) *Attorney, Agent, or Firm*—Troxell Law Office PLLC

(57) ABSTRACT

An electrical connector for a chip module including an insulator body and a conductive terminal. The insulator body has a plurality of receptor holes. Each of the plurality of receptor holes has a first conductive terminal and a second receptor hole. A first end of the first conductive terminal forms a first conductive connecting section connected to a terminal of the chip module and a second end forming a press-on section. A first end of the second conductive terminal forms a second conductive connecting section that could be electrically connected to an external electronic terminal and a second end forms an elastic section that presses against the press-on section of the first conductive terminal. At least one part of the first conductive connecting section is located at an oblique angle relative to an outer edge of the insulator body.

10 Claims, 7 Drawing Sheets

ELECTRICAL CONNECTOR FOR A CHIP MODULE

BACKGROUND OF THE INVENTION (a) Field of the Invention

This invention is regarding the design of a kind of electrical connector, in particular a kind of electrical connector for the connection with the pressed on contact of chip module.

(b) Description of the Prior Art

In the present market, there is a kind of LGA chip module available in some electronic products (such as PC). The conductive connection side of this kind of chip module is in the form of a washer. The electrical connector connecting to it is designed with a terminal in contact with a pressed on conductive terminal. The electrical connector of the present art includes the insulator body and conductive terminal. The insulator body is installed with a conductive terminal receptor for housing the conductive terminal. The holding part is formed in one body, including the holding part that is held in the main body. The holding part extending downward is designed with the soldering section to be soldered to PCB. The part extending upward is designed with a contact portion that is connected to the press-on part of the chip module. Though the conductivity of this kind of electrical connector is higher, its receptor usually is in rectangular form and aligned in parallel with the main body. This results in the distance between two conductive terminals becoming too large and cannot be tightly arranged. Also, in assembling the chip module, the conductive terminal tends to slant on one side that could easily create level shifting. The shape of the terminal is also quite complicated and takes up a larger space. It is also prone to generate higher inductor effect with the neighboring terminal, which is not in favor of high frequency transmission.

Hence, there is a need to design a kind of electrical connector to overcome the above problem.

SUMMARY OF THE INVENTION

The objective of this invention is to provide an innovative design of a kind of electrical connector that can be tightly arranged and at the same time realize the fast communication between electronic component and PCB.

To realize the above objective, the electrical connector of the present invention comprises the insulator body and conductive terminal, the insulator body is designed with several terminal receptors, in which the features are: each receptor hole is designed with the first conductive terminal and the second conductive terminal; the first conductive terminal forms the first conductive connecting portion that could be electrically connected to external electronic component, and the other end forms the press-on section; one end of the second conductive terminal forms the second conductive connecting section that could be electrically connected to external electronic component, and the other end forms the elastic section that could press against the above said press-on section, and at least one part of the first conductive connecting terminal presents slanting arrangement.

Comparing to the present art, the electrical connector of this invention can be tightly arranged, and can effectively reduce inductor effect, and better meets the need of high frequency circuits, thus realizing the fast transmission between electronic component and PCB.

DETAILED DESCRIPTION OF THE PREFERRED EMBODIMENTS

Figure 1:
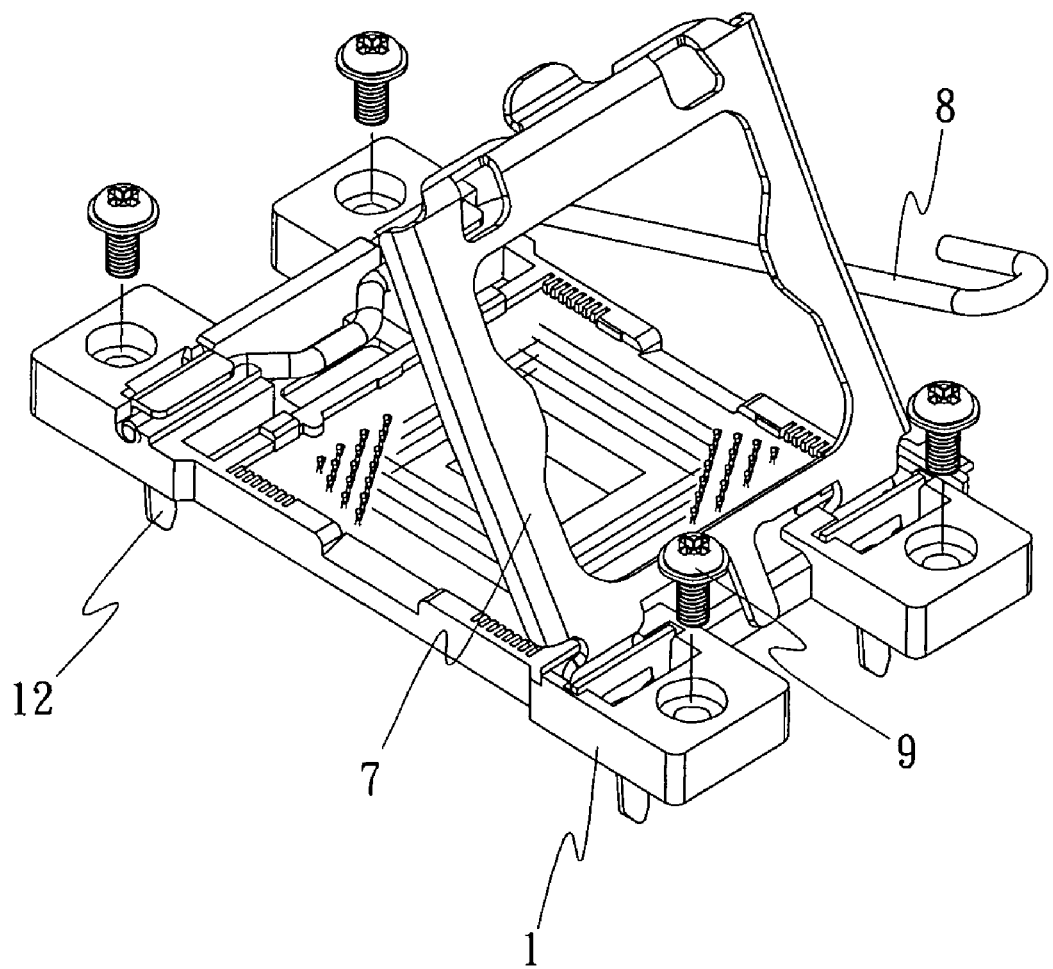
FIG. 1 is the 3D assembly diagram of the electrical connector of this invention.
Figure 2:
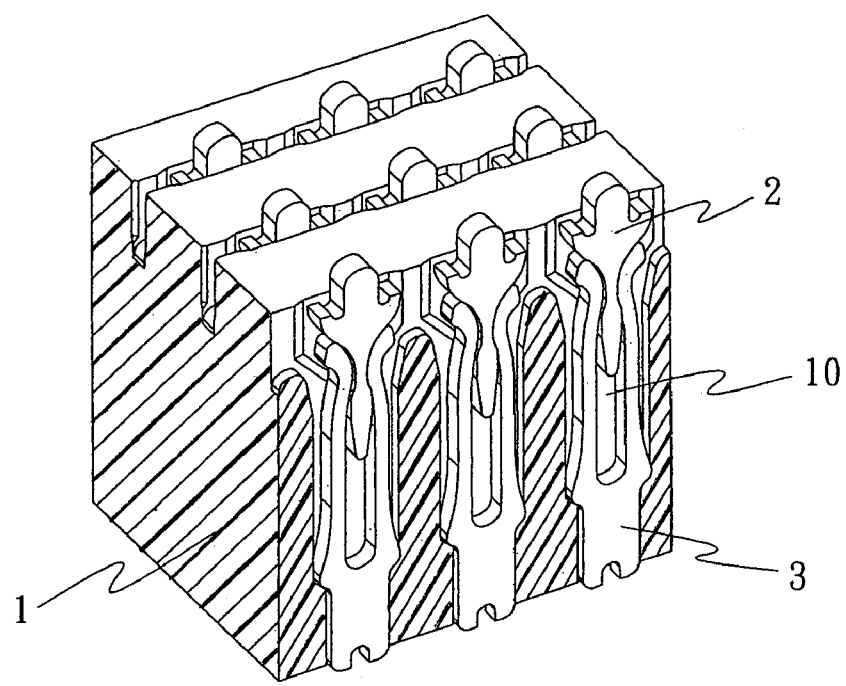
FIG. 2 is the 3D illustration of the electrical connector of this invention.
Figure 3:
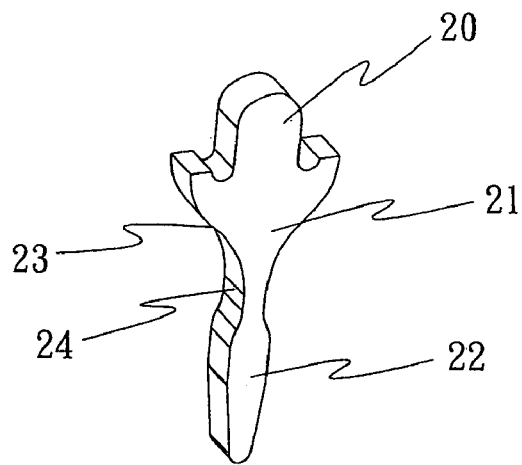
FIG. 3 is the 3D illustration of the electrical connector of this invention.
Figure 4:
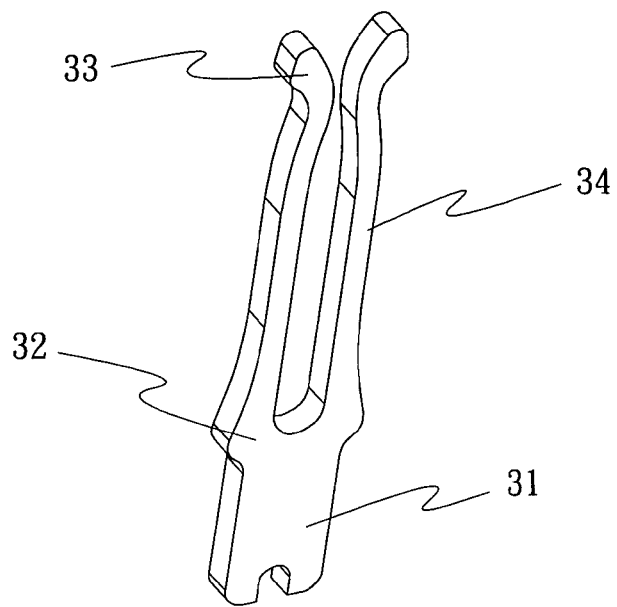
FIG. 4 is the 3D illustration of the electrical connector of this invention.
Figure 5:
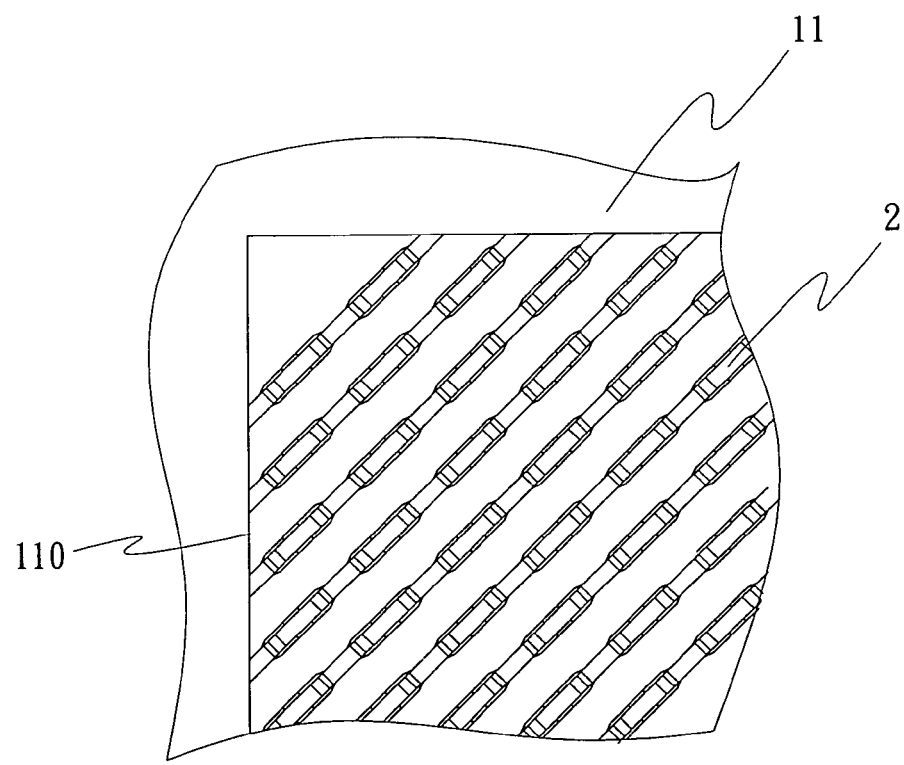
FIG. 5 is the top view of the electrical connector of this invention.
Figure 6:
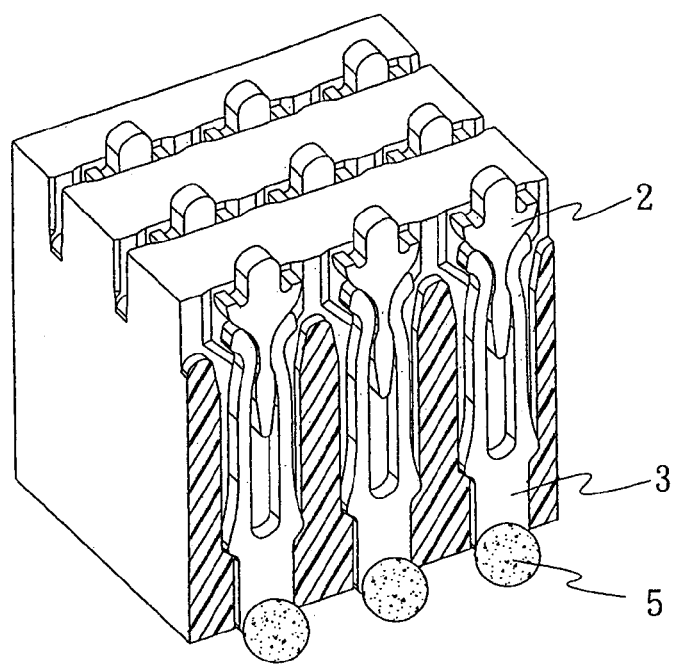
FIG. 6 is the illustration of the electrical connector of this invention with solder ball.
Figure 7:
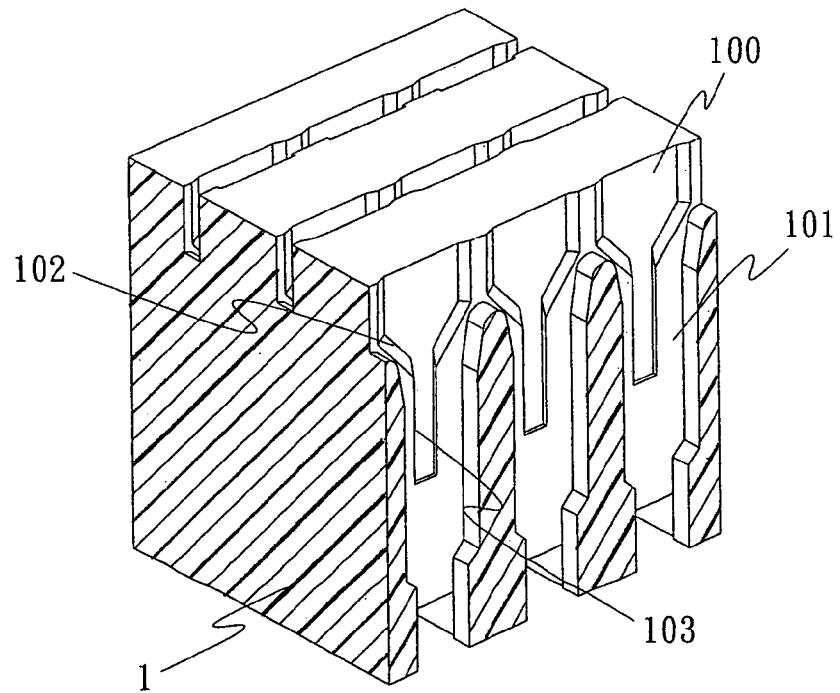
FIG. 7 is the illustration of the insulator body of the electrical connector of this invention.

Please refer to FIGS. 1 through 7. The electrical connector of this invention comprises the insulator body 1 and the conductive terminal, one end is the top cover body 7 for pressing against the chip module, and installed on the other end of the insulator body is designed with a joystick 8 for pressing the top cover 7 to the insulator main body. On the four sides of the insulator body a connecting structure 9 is designed for connecting the electrical connector to PCB, where on the insulator body 1 is designed with several terminal receptor holes 10; each receptor hole 10 is designed with the interconnecting first conductive terminal 2 and the second conductive terminal 3; the two conductive terminal can move relative to each other; the said second conductive terminal 3 can be fitted into the receptor 10, the first conductive terminal 2 can be moved to connect to the second conductive terminal 3; the said first conductive terminal 2 and the second conductive terminal 3 can both be stamped metal laminates, where the thickness of the first electrical connector 2 can be thicker than the thickness of the second terminal 3.

The said insulator body 1 is designed with a depressed space 11 for positioning the corresponding electrical component (chip module in this embodiment, of course can also be other electronic components), the receptor hole inside the stated insulator body 1 can at least form the wider first receptor space 100 and the second receptor space 101, where the first receptor space 100 could receive and position the first conductive terminal 2, the second receptor space 101 could receive and position the second conductive terminal 3, where the first receptor space 100 is designed with the first sidewall 102 and the second sidewall 103; the height of the first sidewall 102 is lower than the height of the second sidewall 103. In addition, a positioning section 12 is design into the bottom of the insulator body 1 in order to position the said insulator body to PCB.

One end of the stated first conductive terminal 2 could form the first conductive connecting section 20 that could be electrically connected to the chip module, and at least one part of the first conductive section 20 presents slanting alignment, and forming 45 degrees angle with the insulator sidewall 110 (of course it could be other magnitude of an angle, but best is an angle between 30 to 60 degrees); the other end forms the press-on section 21, and both sides of the lower side of the press-on section 21 is designed with a sloping surface 23, the facing of which is towards the second conducting terminal 3 and outwards, the press-on section 21 extending towards the second conductive terminal 3 is designed with an insertion section 22, and the insertion section 22 is designed with a groove 24. One end of the second conductive terminal 3 forms the second conductive connecting section 31 that could be electrically connected to external electronic component (PCB in this embodiment, of course can be other electronic components), the other end forms the elastic section 32 that could elastically press against the above stated press-on section 21. The elastic section 32 includes two elastic arms 34 that are in parallel in general, the ends of the two elastic arms 34 could be pressed against the sloping surface 23, the ends of the two elastic section 32 has a corresponding stopping section 33, the stopping section 33 can be matched with the groove 24 and clicked into position through the matched depression and protrusion. In addition, the second conductive connecting section 31 of the said second conductive terminal is connected to soldering material 5, that can solder the second conductive terminal 3 to PCB.

Figure 8:
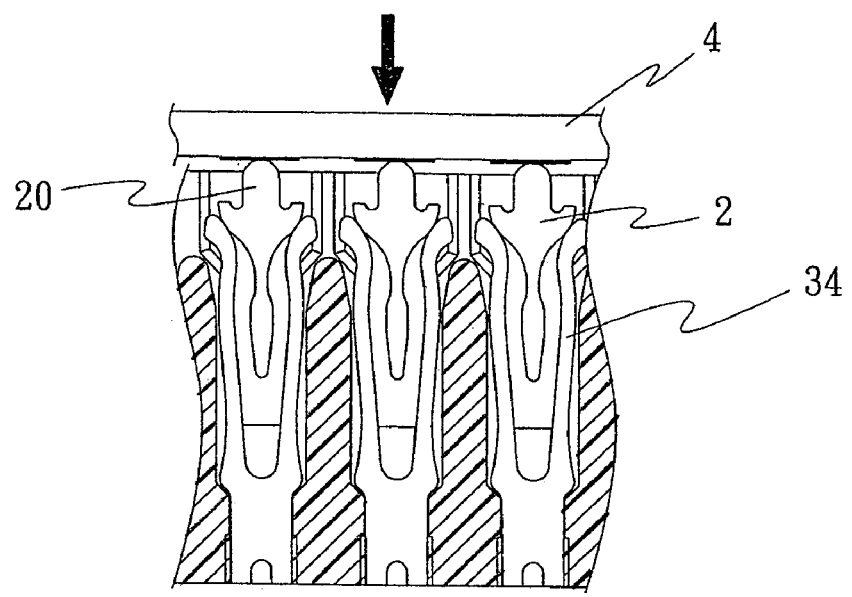
FIG. 8 is the illustration of the electrical connector of this invention installed with chip module.
Figure 9:
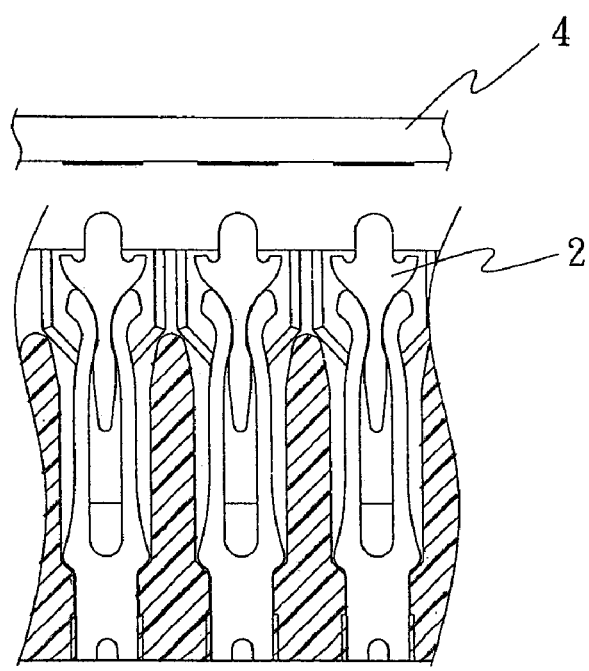
FIG. 9 is the illustration of the electrical connector of this invention before press-on connection of chip module.

Please refer to FIGS. 8 and 9. When installing chip module 4 and the first conductive terminal 2 is pressed downward, the sloping surface of the conductive terminal will be used to move with respect to each other, resulting the shifting of elastic arm 34. When not being pressed, the elastic arm 34 returns to the original shape, and spring back the first conductive terminal 2 so that it returns to the original position. In this way, the electrical connector that is pressed to contact is formed.

Figure 10:
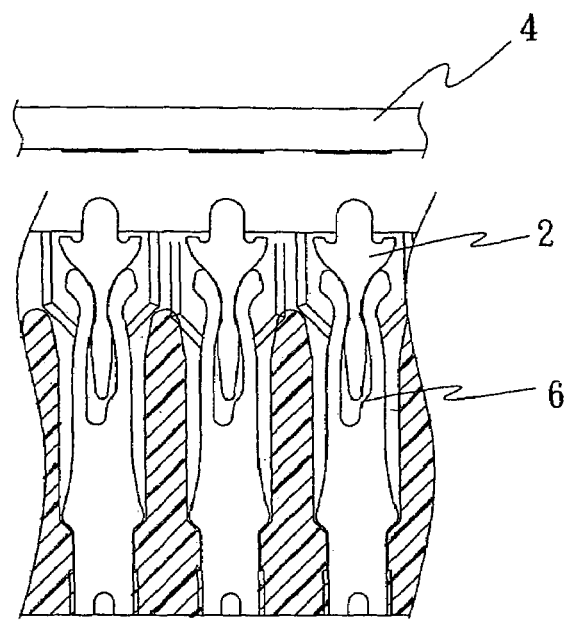
FIG. 10 is the illustration of the second embodiment of the electrical connector of this invention.

Please refer to FIG. 10. The illustration is the second embodiment of this invention. The difference from the above stated embodiment is in the shifting structure 6 designed to the two conductive terminals. As the two conductive terminals move relative to each other, the stated first conductive terminal 2 will generate shifting on level direction, enabling the scratching action between the first conductive connecting section 20 and the chip module 4. In this way, the oxidation film could be removed and enabling the two having better electrically connected press-on contact.

Figure 11:
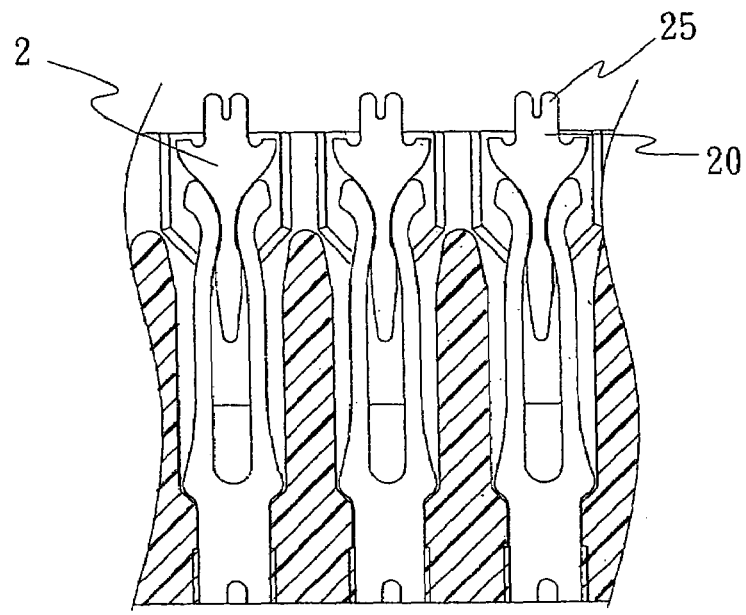
FIG. 11 is the illustration of the third embodiment of the electrical connector of this invention.

Please refer to FIG. 11. The illustration is the third embodiment of the electrical connector of this invention. The difference from the first embodiment is in that the top of the conductive connecting section of the first conductive terminal 2 forms two contacting points 25 for the electrical connection with the chip module.

Figure 12:
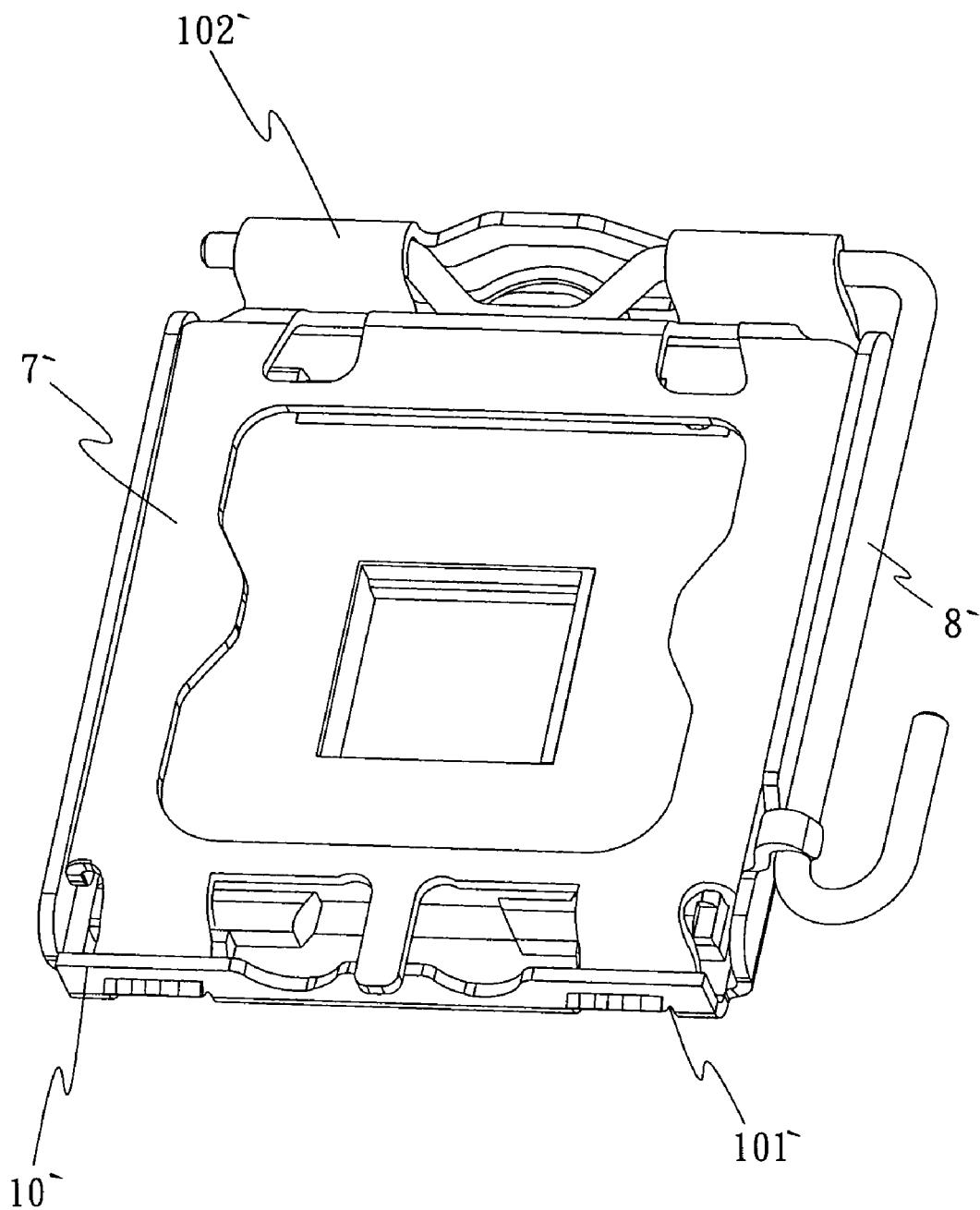
FIG. 12 is the 3D diagram of the fourth embodiment of the electrical connector of this invention.

Please refer to FIG. 12. The illustration shows the fourth embodiment of the electrical connector of this invention. The difference from the first embodiment is that in this embodiment the top cover 7' of the said electrical connector is not connected to the insulator body. The said electrical connector is designed another metal base 10'; the insulator body 1 is fitted into the metal base 10', one end of the metal base 10' is designed with the central connecting hole 101' of the top cover 7'; the other end of the centrally connected connection section 102' is designed with the joystick 8', which could also achieve the above stated result in the implementation process.

What is claimed is:

1. An electrical connector for a chip module, the electrical connector comprising:
   a) an insulator body having a plurality of receptor holes; and
   b) a plurality of conductive terminals, one of the plurality of conductive terminals is inserted into each of the plurality of receptor holes, each of the plurality of conductive terminals having:
      l) a first conductive terminal having a first terminal first end being a first conductive connecting section and a first terminal second end being a press-on section, the first conductive connecting section of each of the plurality of conductive terminals is positioned at an oblique angle relative to an outer edge of the insulator body; and
      ii) a second conductive terminal having a second terminal first end being a second conductive connecting section and a second terminal second end being an elastic section, the press-on section of the first conductive terminal is inserted into the elastic section of the second conductive terminal.

2. The electrical connector according to claim 1, wherein the oblique angle is between 30 degrees and 60 degrees.

3. The electrical connector according to claim 1, wherein each of the first conductive terminal and the second conductive terminal are stamped metal laminates.

4. The electrical connector according to claim 1, wherein the first conductive terminal has a thickness greater than a thickness of the second conductive terminal.

5. The electrical connector according to claim 1, wherein the first conductive terminal has two sloping surfaces, one of the two sloping surfaces is located on each of two opposing edges thereof, the second conductive terminal has two elastic arms and two stopping sections, the two sloping surfaces and the two opposing edges have matching curved shapes.

6. The electrical connector according to claim 1, wherein the first conductive terminal is selectively movable in an upwardly direction and a downwardly direction relative to the second conductive terminal maintaining contact with the chip module.

7. The electrical connector according to claim 1, wherein the insulator body has a side frame located on a protruding edge thereof positioning the chip module.

8. The electrical connector according to claim 1, wherein the insulator body has a positioning pillar located on a bottom thereof.

9. The electrical connector according to claim 1, wherein each of the plurality of receptor holes has a first receptor space and a second receptor space, a width of the first receptor space is greater than a width of the second receptor space.

10. The electrical connector according to claim 9, wherein the first receptor space of each of the plurality of receptor holes has a first sidewall and a second sidewall, a height of the first sidewall is less than a height of the second sidewall.

* * * * *